(12) United States Patent
Namerikawa et al.

(10) Patent No.: US 10,598,369 B2
(45) Date of Patent: Mar. 24, 2020

(54) HEAT DISCHARGE STRUCTURES FOR LIGHT SOURCE DEVICES AND LIGHT SOURCE SYSTEMS

(71) Applicant: NGK INSULATORS, LTD., Aichi-prefecture (JP)

(72) Inventors: Masahiko Namerikawa, Seto (JP); Takashi Yoshino, Ama (JP); Katsuhiro Imai, Nagoya (JP); Yoshitaka Kuraoka, Okazaki (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 16/010,977

(22) Filed: Jun. 18, 2018

(65) Prior Publication Data

US 2018/0306428 A1    Oct. 25, 2018

Related U.S. Application Data

(63) Continuation of application No. 15/413,992, filed on Jan. 24, 2017, now abandoned.

(51) Int. Cl.
*F21V 29/70*    (2015.01)
*H01L 33/64*    (2010.01)
(Continued)

(52) U.S. Cl.
CPC .......... *F21V 29/70* (2015.01); *F21V 19/0015* (2013.01); *F21V 29/503* (2015.01);
(Continued)

(58) Field of Classification Search
CPC .... F21V 19/0015; F21V 29/503; F21V 29/70; F21V 29/85; H01L 33/642;
(Continued)

(56) References Cited

U.S. PATENT DOCUMENTS 6,355,497 B1 * 3/2002 Romano ............... H01L 33/007
257/E21.119
7,306,981 B2   12/2007 Kuwabara et al.
(Continued)

FOREIGN PATENT DOCUMENTS

JP    1-181490 A      7/1989
JP    2002-057158 A   2/2002
(Continued)

OTHER PUBLICATIONS

Office Action from Japanese Patent App. No. 2016-012059 (dated Dec. 13, 2018).
(Continued)

*Primary Examiner* — Tsion Tumebo
(74) *Attorney, Agent, or Firm* — Cermak Nakajima & McGowan LLP; Tomoko Nakajima

(57) ABSTRACT

A heat discharge structure that includes a film of a nitride of a group 13 element having a first main face, a second main face and an outer side end face. The structure further includes a portion for containing the light source device. The portion has a through hole opening at the first main face and the second main face, and a fixing face for fixing the light source device. The fixing face faces the through hole and contacts the light source device.

8 Claims, 7 Drawing Sheets

(51) Int. Cl.
*H01S 5/024* (2006.01)
*F21V 29/503* (2015.01)
*F21V 29/85* (2015.01)
*F21V 19/00* (2006.01)
*H01S 5/022* (2006.01)
*H01S 5/323* (2006.01)

(52) U.S. Cl.
CPC ............ *F21V 29/85* (2015.01); *H01L 33/642* (2013.01); *H01S 5/02476* (2013.01); *H01S 5/02276* (2013.01); *H01S 5/02469* (2013.01); *H01S 5/32341* (2013.01)

(58) Field of Classification Search
CPC ............ H01S 5/02276; H01S 5/02469; H01S 5/02476; H01S 5/32341
See application file for complete search history.

(56) References Cited

U.S. PATENT DOCUMENTS

| | | | |
|---|---|---|---|
| 7,894,498 | B2 | 2/2011 | Miyazaki |
| 9,203,213 | B2 | 12/2015 | Yamanaka et al. |
| 9,765,934 | B2 | 9/2017 | Rogers et al. |
| 9,911,842 | B2 | 3/2018 | Umeno et al. |
| 2002/0096692 | A1 | 7/2002 | Nakamura et al. |
| 2010/0045919 | A1 | 2/2010 | Chida et al. |
| 2012/0068207 | A1* | 3/2012 | Hata .................. H01L 27/1446 257/94 |
| 2012/0320581 | A1* | 12/2012 | Rogers .................. H01L 24/24 362/235 |
| 2014/0112363 | A1 | 4/2014 | Feitisch et al. |
| 2014/0226317 | A1 | 8/2014 | Livesay et al. |
| 2015/0023376 | A1 | 1/2015 | Yamanaka et al. |
| 2015/0155439 | A1 | 6/2015 | Cich et al. |

FOREIGN PATENT DOCUMENTS

| | | |
|---|---|---|
| JP | 2009-064961 A | 3/2009 |
| WO | WO2013/128794 A1 | 9/2013 |

OTHER PUBLICATIONS

Kuznetsov, N. I., et al., "Insulating GaN:Zn layers grown by hydride vapor phase epitaxy on SiC substrates," Appl. Phys. Lett. 1999;75(20):3138-3140.

Extended European Search Report for European Patent App. No. 17152832.6 dated Aug. 18, 2017.

"162'th committee of wide-gap semiconductor optical—electronic devices," documents for 96'th study meeting, pp. 30-35, "high-output blue-violet semiconductor laser and its application to hugh-luminance illumination," (Japan Society for the Promotion of Science).

* cited by examiner

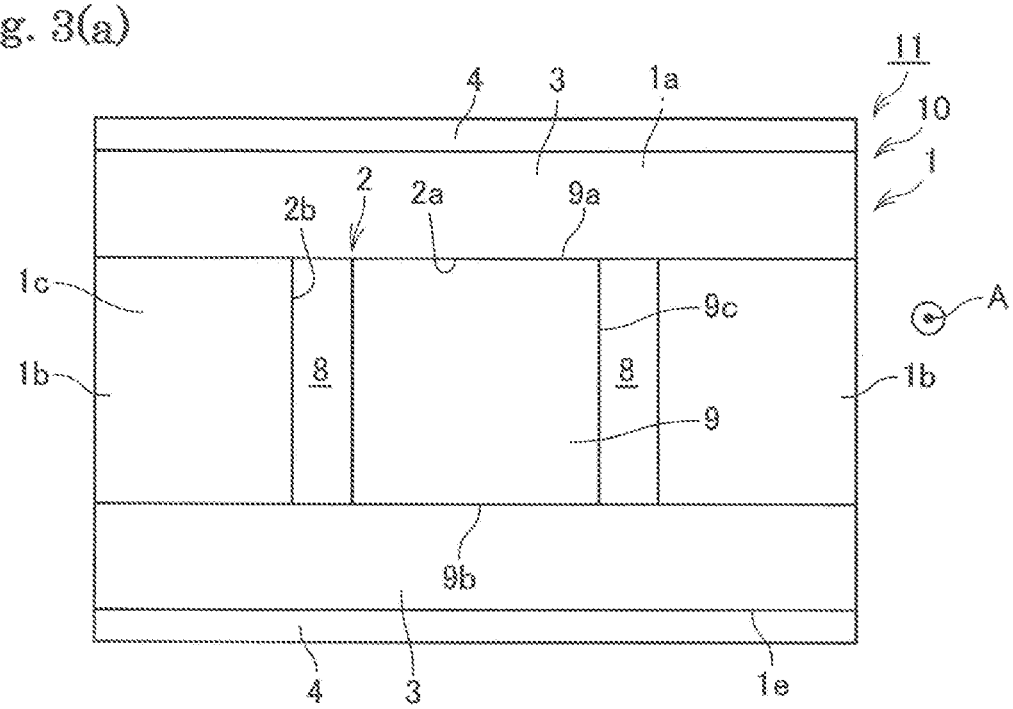
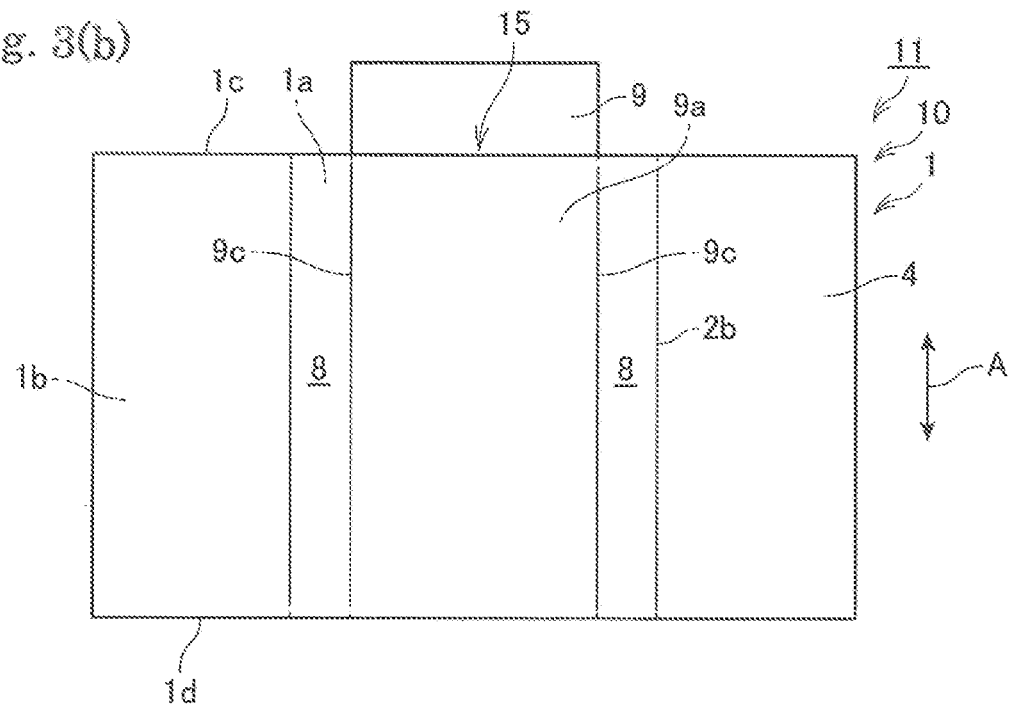

HEAT DISCHARGE STRUCTURES FOR LIGHT SOURCE DEVICES AND LIGHT SOURCE SYSTEMS

This application is a continuation of, and claims priority under 35 U.S.C. § 120 to, U.S. patent application Ser. No. 15/413,992, filed Jan. 24, 2017, and claims priority therethrough under 35 U.S.C. § 119 of Japanese Patent Application No. P2016-012059 filed on Jan. 26, 2016, the entireties of which are incorporated by reference.

TECHNICAL FIELD

The present invention relates to a heat discharge structure for a light source device and a light source system.

RELATED ART STATEMENT

A semiconductor light source device has been widely used as a light source for optical communication or a pick-up used for an optical disk. Recently, a laser light source of a nitride semiconductor has been studied as light sources for a projector, a automobile head lamp and the like.

For widening the applications of the semiconductor laser light source to those requiring a high luminance, it is necessary to improve the optical output. However, according to the semiconductor laser, injected current and oscillated optical output are locally concentrated, so that heat generated due to ineffective current is concentrated locally. It is thus necessary to discharge the excessive heat generated in the light source device to the outside, so that it becomes necessary to discharge the heat to the outside through a submount or a package. However, as the heat is conducted from the light source device through the submount or package, the temperature of the whole light source device is raised, so that it becomes difficult to increase the optical output to some extent or more.

A heat discharge structure for a light source device of so-called dual-face heat discharge structure was thus proposed (Non-patent document 1). According to such structure, a submount is contained in a package and a light source device chip is mounted on the submount, so that the heat is dissipated from the light source device through the submount to the package. At the same time, an upper heat discharge block separated from the submount is mounted on the light source device to facilitate the conduction of the heat from the upper heat discharge block. It has been used, in many cases, aluminum nitride having a high thermal conductivity as a material of the submount or the upper heat discharge block.

PRIOR TECHNICAL DOCUMENT

Non-Patent Document (Non-Patent Document 1) "162'th committee of wide-gap semiconductor optical•electronic devices"; documents for 96'th study meeting, pages 30 to 35, "high-output blue-violet semiconductor laser and its application to high-luminance illumination" (Japan Society for the Promotion of Science)

SUMMARY OF THE INVENTION

However, according to the dual-face heat discharge structure, in addition to the submount of the prior art, the upper heat discharge block is further added to sandwich the light source device between them. As a result, the heat discharge structure becomes complex as a whole to result in reduction of productivity. In addition to this, for fixing the light source device between the submount and upper heat discharge block, it is necessary to provide a spacer between the submount and upper heat discharge block to maintain a distance between them constant, so that the heat is also discharged through the spacer. As the structure is complex as described above, in the case that heating and cooling of the light source device is repeated, the difference of the thermal expansion coefficients of the respective members may cause minute shift of the position of the light source device or generate cracks in the respective members.

An object of the present invention is to provide a heat discharge structure for a light source device for fixing a light source device emitting a semiconductor laser and for discharging a heat, in which the productivity of the structure can be improved and the shift of the position of and cracks in the light source device can be prevented in use.

The present invention provides a heat discharge structure for a light source device emitting a semiconductor laser, said structure fixing the light source device and discharge heat, said structure comprising:

a film of a nitride of a group 13 element, said film comprising a first main face, a second main face and an outer side end face;

a portion for containing the light source device, said portion comprising a through hole opening to the first main face and the second main face, and:

a fixing face for fixing the light source device, the fixing face facing the through hole and contacting the light source device.

The present invention further provides a light source system, comprising:

the structure; and a light source device contained in the portion for containing the light source device, the light source device being fixed on the fixing face for fixing the light source device.

According to the present invention, the through hole provided in the film is utilized as the portion of containing and fixing face for fixing the light source device. Such structure is simple so that it is possible to improve the productivity of the structure and to reduce the shift of the position of and cracks in the light source device in use.

BRIEF DESCRIPTION OF THE DRAWINGS

FIG. 3(a) is a front view showing a light source device 11 obtained by containing the light source device in the structure 10, and FIG. 3(b) is a side view of the light source system 11.

EMBODIMENTS FOR CARRYING OUT THE INVENTION

Figure 1A:
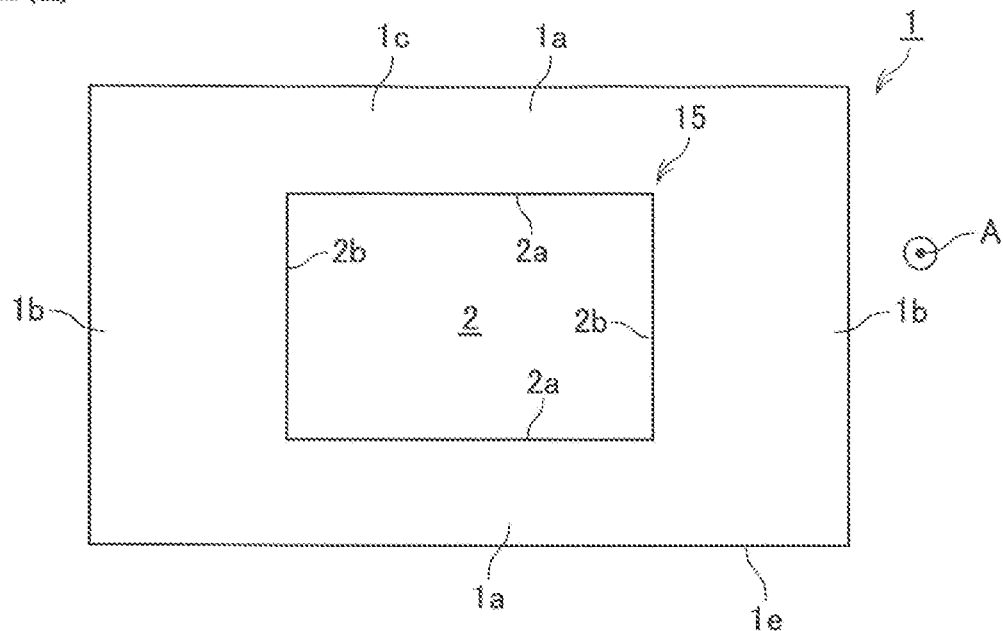
FIG. 1(a) is a front view showing a structure 1 of discharging heat of a light source device, according to the inventive example.
Figure 1B:
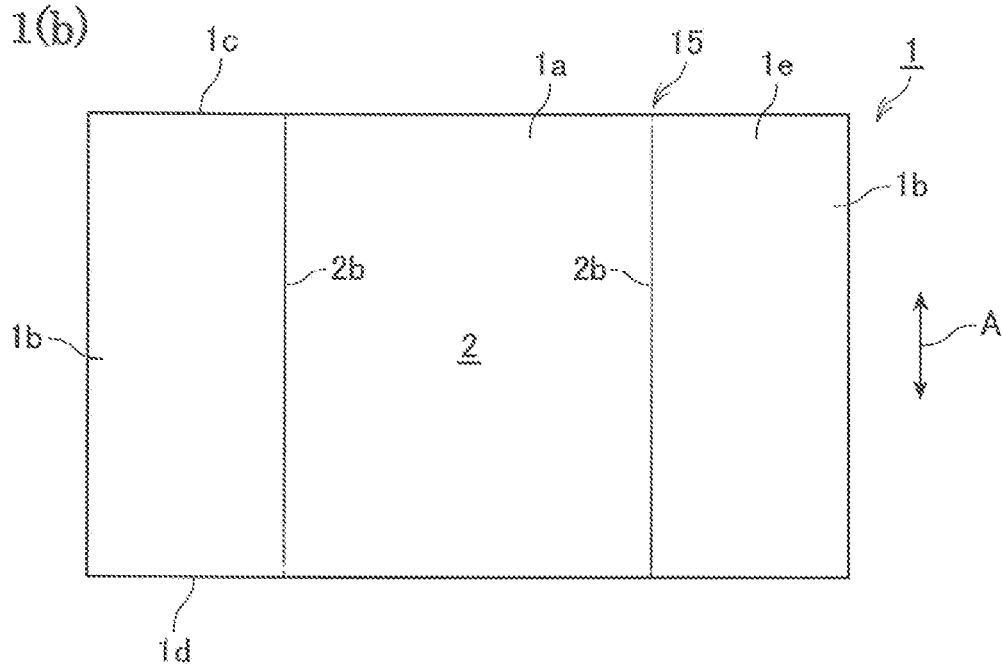
FIG. 1(b) is a side view of the structure 1.

As shown in FIG. 1, a structure 1 of an inventive example is composes of a film of a nitride of a group 13 element. FIG. 1(a) is a diagram showing the film in a direction perpendicular to a direction A of thickness of the film, and FIG. 1(b) is a diagram showing the film in the direction A of thickness of the film.

A through hole 2 is provided in the film and is extended from a first main face 1c to a second main face 1d. According to the present example, the through hole 2 has a shape of a quadrilateral in a plan view. A pair of inner wall faces 2a are thus opposed to each other across the through hole 2. Further, a pair of inner wall faces 2b are opposed to each other across the through hole 2. According to the present example, a pair of the inner wall faces 2a is assigned to the fixing faces for fixing the light source device. As a result, the fixing faces 2a are utilized as the fixing faces for fixing the light source device and the inner wall faces 2b are formed on the sides of main wall portions 1b.

Figure 2B:
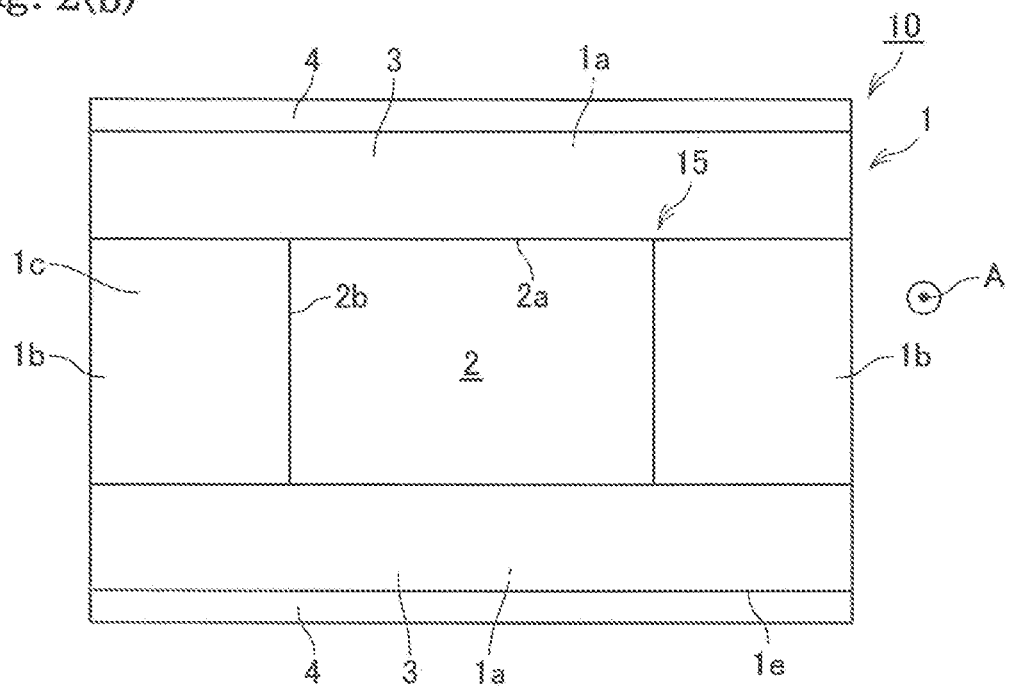
FIG. 2(b) is a side view of the structure 10.
Figure 2A:
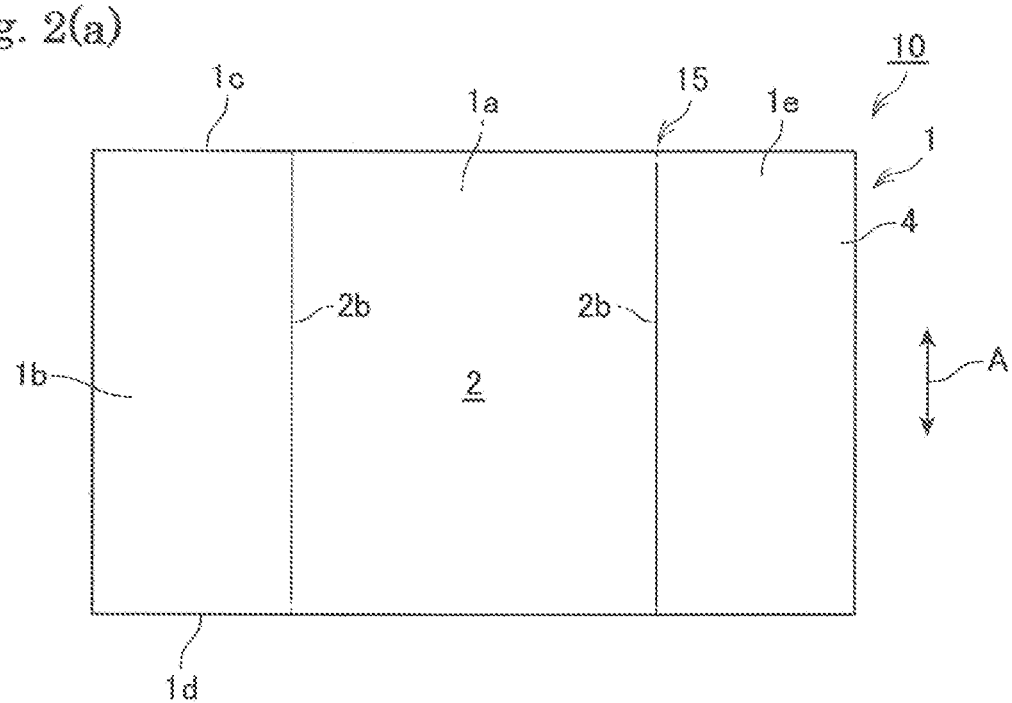
FIG. 2(a) is a front view showing a structure 10 obtained by forming electrodes on the structure 1.

According to a preferred embodiment, an electrode for a light emitting device is provided in the inventive structure. For example, according to the structure 10 shown in FIG. 2, a pair of electrodes 3 is provided on the first main face 1c of the structure 1, and electrodes 4 are further provided on an outer side end face 1e. Each of the electrodes 4 is electrically connected to each of the electrodes 3, and the respective electrodes 3 are separated from each other through the through hole 2. A predetermined electric power can be supplied to the light source device through the pair of the electrodes 3.

FIG. 3 shows a light source system 11, in which a light source device 9 is contained in a structure 10. The through hole 2 functions as a portion 15 of containing a light source device. The light source device is contained in the through hole, while the respective inner wall faces 2a function as the fixing faces of fixing the light source device. In this state, a pair of end faces 9a, 9b of the light source device 9 contacts the fixing face 2a, and spaces 8 are formed between the inner wall faces 2b of the light source device and end faces 9c, respectively. In this state, wiring is provided between terminals (not shown) and the electrodes 3 of the light source device so that the light source device is ready to operate.

According to the present invention, the heat discharge structure of the light source device is composed of a film of a nitride of a group 13 element. Group 13 element means group 13 element according to the Periodic Table determined by IUPAC. The group 13 element is specifically gallium, aluminum, indium, thallium or the like. The nitride of the group 13 element is most preferably GaN, AlN or AlGaN. Further, in the case that the contained optical device is a GaN-based optical device, the nitride of the group 13 element may most preferably be GaN. In the case that the film of the group 13 element is made of GaN, it becomes possible to reduce the difference of the thermal expansion coefficients of the contained GaN series optical device and the film of the nitride of the group 13 element. As a result, it is possible to prevent the damages of the optical device and the structure for discharging heat from the light source device, due to the difference of thermal expansion coefficients.

The film of the nitride of the group 13 element includes the first main face, the second main face and the outer side end face. Here, although the planar shape of the film of the nitride of the group 13 element is not particularly limited, it may preferably be quadrilateral.

It is provided, in the film of the nitride of the group 13 element, a portion of containing the light source device composed of a through hole opening at the first main face and second main face. Here, it is not necessary that the whole of the light source device is contained in the portion of containing the light source device, and a part of the light source device 9 may be protruded from the through hole 2, as shown in FIG. 3(b).

The face for fixing the light source device facing the through hole and contacting the light source is provided in the portion for containing the light source device. Then, upon emitting light, heat is conducted from the light source device to the heat discharge structure through the fixing face, and then finally discharged to the package.

According to a preferred embodiment, a plurality of the faces for fixing the light source device are provided in the structure. It is thus possible to facilitate the discharge of the heat from the light source device. Preferably, two faces for fixing the light source device are provided in the structure. Most preferably, two faces for fixing the light source device are opposed to each other across the through hole.

According to a preferred embodiment, a pair of electrodes for the light source device is provided on the first main face, and the electrodes are opposed to each other on the first main face across the through hole. When the inventive structure is produced, a lot of the structures are usually formed on a wafer at the same time. Thus, such electrodes on the main faces can be formed by patterning on the wafer, so that its productivity is particularly high.

The difference of the thermal expansion coefficient of the base body of the light source device and the thermal expansion coefficient of the nitride of the group 13 element forming the inventive stricture may preferably be 20 percent or smaller of the thermal expansion coefficient of the nitride of the group 13 element forming the structure. On such viewpoint, the material forming the base body of the light source device may preferably be GaN, AlN or AlGaN.

It will be described an example of producing the inventive structure below.

Figure 4A:
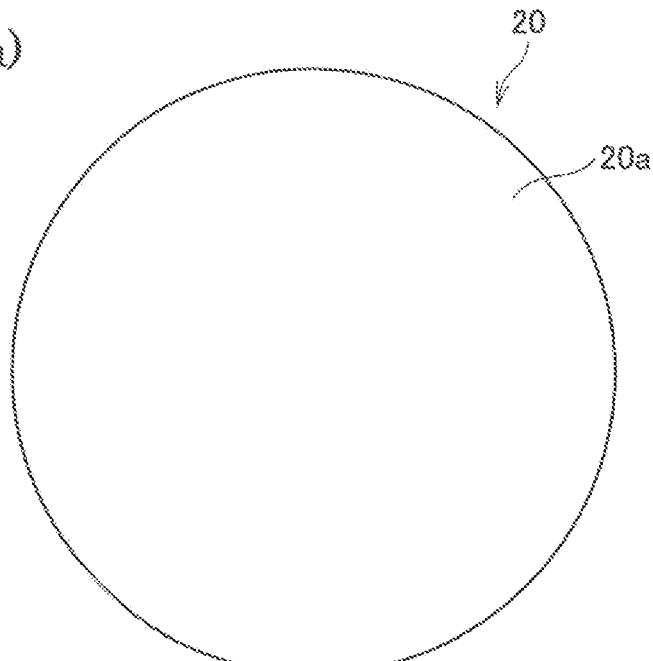
FIG. 4(a) is a plan view showing a base body 20 for film formation.
Figure 4B:
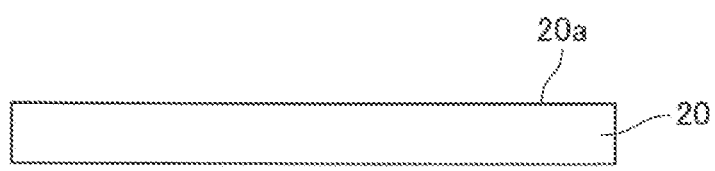
FIG. 4(b) is a side view of the base body 20.
Figure 4C:
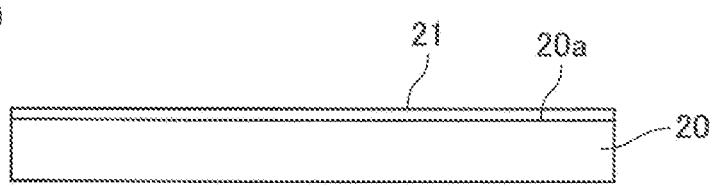
FIG. 4(c) shows state that a seed crystal film 21 formed on the base body 20.

First, as shown in FIGS. 4(a) and (b), a base body 20 is prepared. Then, as shown in FIG. 4(c), a seed crystal film 21 is formed on a film-forming face 20a of the base body 20.

A single crystal material, such as sapphire, GaN AlN, or the like, may be used for the base body. However, in applications providing a heat discharge structure as the present invention, it is more preferable to use an oriented ceramic material for the base body, on the viewpoint of reducing the cost. As such kind of the oriented ceramic material, aluminum oxide, zinc oxide and aluminum oxide are exemplified. More preferably, the base body is a substrate of aluminum oxide composed of a polycrystalline body whose c-axis is aligned substantially in a direction perpendicular to the main face.

The method of forming the seed crystal film may preferably be vapor phase process, and metal organic chemical vapor deposition (MOCVD) method, hydride vapor phase epitaxy (HVPE) method, pulse-excited deposition (PXD) method, molecular beam epitaxy (MBE) method and sublimation method are exemplified. Metal organic chemical vapor deposition is most preferred.

Figure 5A:
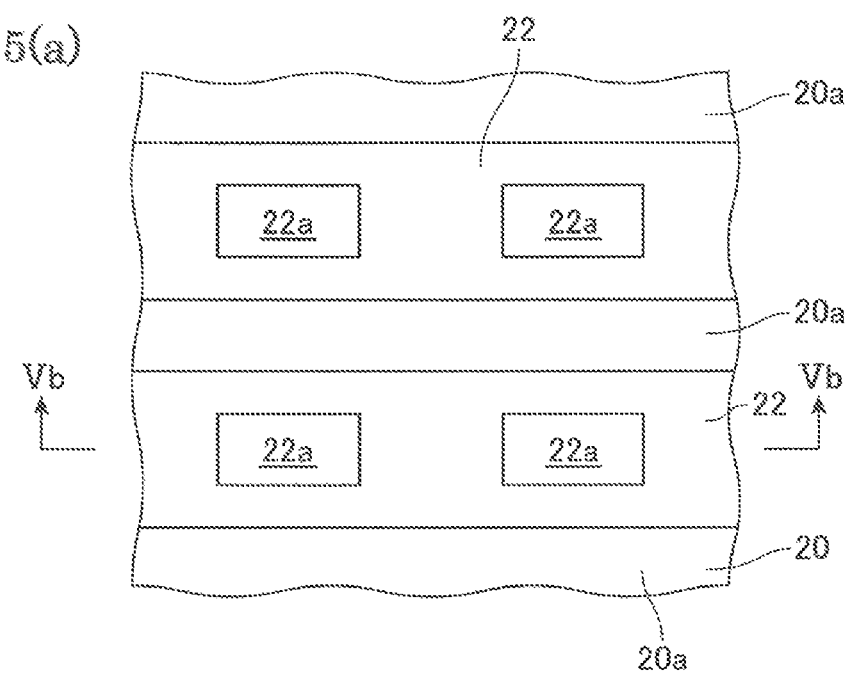
FIG. 5(a) is a plan view showing a base body 20 and a seed crystal film 22 after patterning.
Figure 5B:
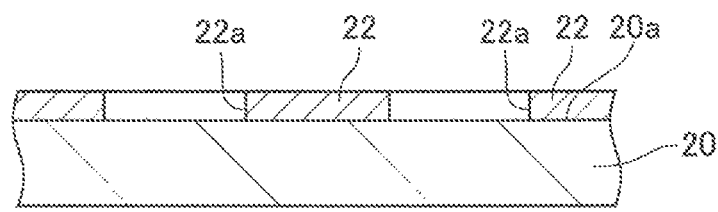
FIG. 5(b) is a cross sectional view cut along Vb-Vb line of FIG. 5(a).

Then, as shown in FIGS. 5(a) and (b), the seed crystal film is patterned by photo lithography to obtain patterned seed crystal films 22. The seed crystal films 22 are provided on the base body (wafer) 20 in elongate strip-like shapes, respectively. As shown in FIG. 5(a), a space is provided between the adjacent seed crystal films 22, and a surface 20a of the base body is exposed to the space. Further, an opening 22a is formed at a predetermined position in each of the seed crystal films 22, and the surface 20a of the base body is exposed through the opening 22a.

Figure 6A:
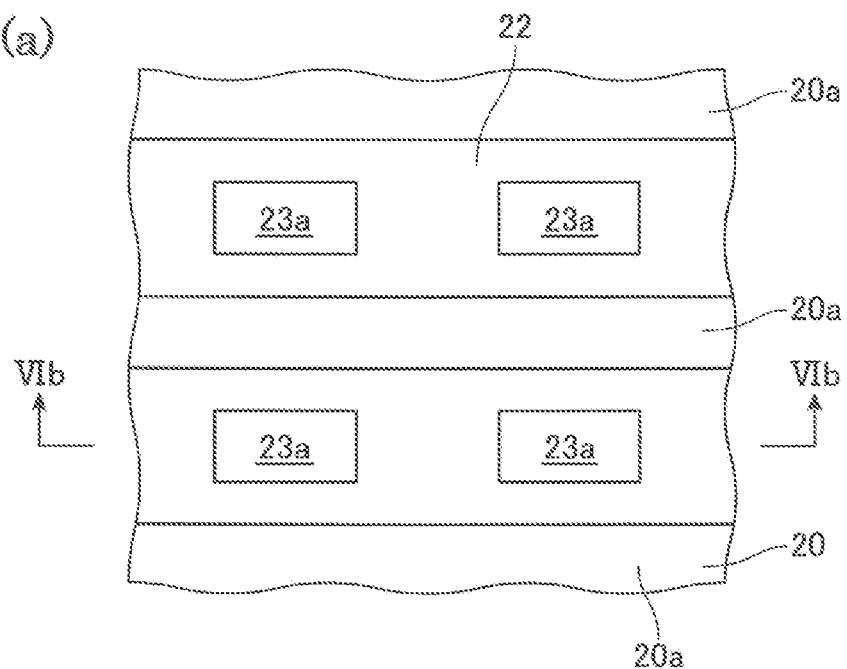
FIG. 6(a) is a plan view showing a base body 20 and a film 23 of a nitride of a group 13 element.
Figure 6B:
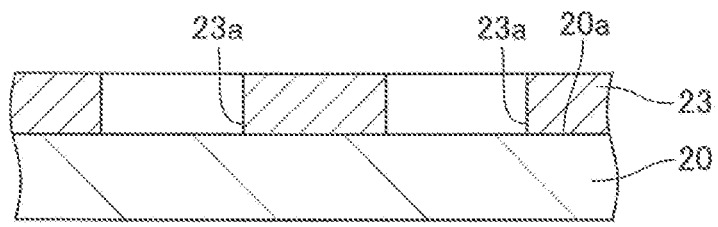
FIG. 6(b) is a cross sectional view cut along VIb-VIb line of FIG. 6(a).

Then, as shown in FIG. 6, a film 23 of a nitride of a group 13 element is formed on the seed crystal film. At this time, the film 23 of the nitride of the group 13 element is grown so as to conform to the planar shape of the underlying seed crystal film 22. Here, according to a preferred embodiment, the seed crystal film and the film of the nitride of the group 13 element are formed of a same kind of material. In this case, as shown in FIG. 6(b), the seed crystal film and the film of the nitride of the group 13 element grown thereon are integrated with each other, so that the interface between them cannot be clearly distinguished. Thus, in FIG. 6(b), a film 23 of a nitride of a group 13 element is shown on the base body and the seed crystal film is not separately depicted.

According to a preferred embodiment, the film 23 of the nitride of the group 13 element is elongated horizontally in a shape of a stripe on the base body (wafer) 20. As shown in FIG. 6(a), a space is provided between the adjacent films 23 of the nitride of the group 13 element, and a surface 20a of the base body is exposed through the space. Further, an opening 23a is formed at a predetermined position in each of the films 23 of the nitride of the group 13 element, and the surface 20a of the base body is exposed through the opening 23a.

The method of forming the film of the nitride of the group 13 element may be vapor phase process such as metal organic chemical vapor deposition (MOCVD) method, hydride vapor phase epitaxy (HVPE) method, pulse-excited deposition (PXD) method, MBE method and sublimation method or the like and liquid phase process such as flux method.

According to a preferred embodiment, zinc is doped into the film of the nitride of the group 13 element. It is thus possible to improve the electrical insulation property of the film of the nitride of the group 13 element.

After the film formation of the nitride of the group 13 element is finished, the underlying base body is removed. At this time, the seed crystal film may be left on the side of the thus formed nitride film of the group 13 element or may be removed with the base body. The removal of the base body may be performed by grinding or laser lift-off method. Then, one or both of the main faces of the film of the nitride of the group 13 element is polished when required.

Figure 7A:
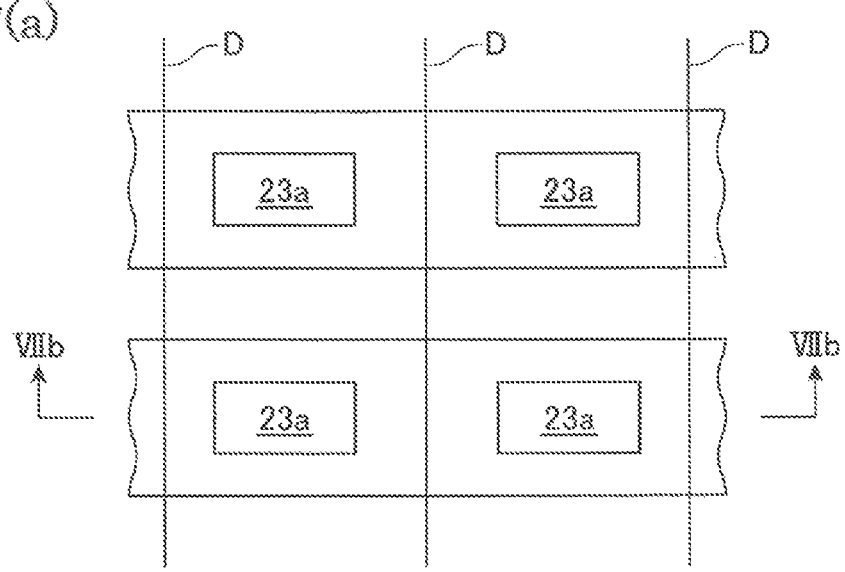
FIG. 7(a) is a plan view showing a cross sectional face of the film 23 of a nitride of a group 13 element.
Figure 7B:
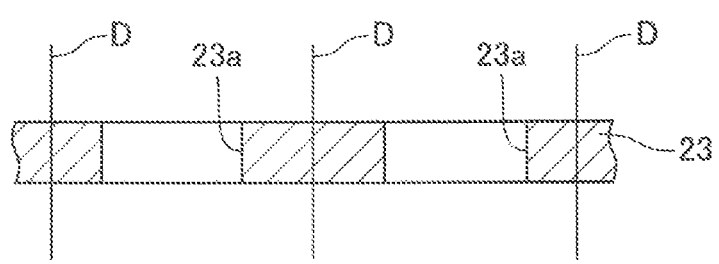
FIG. 7(b) is a cross sectional view showing a cutting face of the film 23.

A lot of the structures are patterned at the same time on the film of the nitride of the group 13 element on the base body 20. As a result, after the film of the nitride of the group 13 element is formed and the base body is removed, each of the films of the nitride of the group 13 element is cut along a cutting line D, for example, as shown in FIG. 7. It is thus possible to obtain the structure shown in FIG. 1.

The invention claimed is:

1. A method of producing a heat discharge structure for a light source device emitting a laser beam, said structure fixing said light source device and discharging a heat,
    said structure comprising:
    a film of a nitride of a group 13 element, said film comprising a first main face, a second main face 1d and an outer side end face;
    a portion for containing said light source device, said portion comprising a through hole opening at said first main face and said second main face, and;
    a fixing face for fixing said light source device, said fixing face facing said through hole and contacting said light source device,
    said method comprising:
    forming a seed crystal film on a film-forming face of a base body;
    patterning said seed crystal film by photo lithography to obtain patterned seed crystal films, so that a first opening is formed at a predetermined position in each of said seed crystal films and said film-forming face of said base body is exposed through said first opening;
    forming films of a nitride of a group 13 element on said seed crystal films, respectively, so that a space is provided between the adjacent films of said nitride of the group 13 element, a second opening is formed at a predetermined position in each of said films of said nitride of the group 13 element and said surface of said base body is exposed through said second opening, said second opening including said first opening; and
    removing said base body.

2. The method of claim 1, wherein said structure comprises a plurality of said fixing faces for fixing said light source device.

3. The method of claim 2, wherein said fixing faces for fixing said light source device are opposed to each other across said through hole.

4. The method of claim 1, wherein said nitride of said group 13 element comprises GaN.

5. The method of claim 1, wherein said nitride of said group 13 element comprises zinc doped therein.

6. The method of claim 1, wherein said structure further comprises an electrode for said light source device.

7. The method of claim 6, wherein said structure comprises a pair of said electrodes provided on said first main face and being opposed to each other across said through hole on said first main face.

8. The method of claim 6, wherein said structure further comprises an outer side electrode provided on said outer side end face.

* * * * *